United States Patent
Watabe

(10) Patent No.: US 10,811,368 B2
(45) Date of Patent: Oct. 20, 2020

(54) METHOD FOR MANUFACTURING SEMICONDUCTOR DEVICE

(71) Applicant: Mitsubishi Electric Corporation, Tokyo (JP)

(72) Inventor: Shunichi Watabe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/507,076

(22) Filed: Jul. 10, 2019

(65) Prior Publication Data
US 2020/0083181 A1    Mar. 12, 2020

(30) Foreign Application Priority Data
Sep. 11, 2018 (JP) .................. 2018-169281

(51) Int. Cl.
*H01L 23/50* (2006.01)
*H01L 21/56* (2006.01)
*H01L 23/00* (2006.01)
*H01L 21/304* (2006.01)

(52) U.S. Cl.
CPC .......... *H01L 23/562* (2013.01); *H01L 21/304* (2013.01); *H01L 21/56* (2013.01)

(58) Field of Classification Search
CPC ...... H01L 23/562; H01L 21/304; H01L 21/56
See application file for complete search history.

(56) References Cited

U.S. PATENT DOCUMENTS

2007/0190908 A1* 8/2007 Tanaka .................. H01L 21/304
                                                                    451/41

FOREIGN PATENT DOCUMENTS

| JP | 2001203255 A | 7/2001 |
| JP | 2004200451 A | 7/2004 |
| JP | 2006196710 A | 7/2006 |

* cited by examiner

*Primary Examiner* — Matthew L Reames
(74) *Attorney, Agent, or Firm* — Studebaker & Brackett PC

(57) ABSTRACT

According a method for manufacturing a semiconductor device of the present invention, a surface protection film having an elastic modulus of 2 GPa or more is formed on a first main surface of a semiconductor wafer where an element structure is formed, the semiconductor wafer is placed on a stage with the first main surface facing the stage, and a second main surface of the semiconductor wafer opposite to the first main surface is ground.

6 Claims, 4 Drawing Sheets

POSITION IN RADIAL DIRECTION

METHOD FOR MANUFACTURING SEMICONDUCTOR DEVICE

BACKGROUND OF THE INVENTION

Field of the Invention

The present invention relates to grinding of a semiconductor wafer.

Description of the Background Art

Semiconductor devices such as memories or microprocessors are densely arranged in a package in accordance with three-dimensional integration or the like. This requires that a semiconductor wafer be thinner. Further, in order to increase current-carrying performance such as on characteristics of power semiconductor devices such as IGBTs, MOSFETs, or diodes mounted on inverter circuits used for motor drive in an industrial or automotive field or on uninterruptible power supplies, a thinning process is performed on semiconductor wafers. At present, thinning of semiconductor wafers to several tens of μm is available.

Such a semiconductor device is manufactured by the following procedure. First, an element structure part including an electrode and an insulating protection film is formed on a front surface of a semiconductor wafer. Next, a thinning process, chemical treatment, heat treatment, electrode formation, and the like are performed on a back surface of the semiconductor wafer. Then, the semiconductor wafer is diced into dies.

The thinning process on the semiconductor wafer is performed by mechanical grinding. The front surface of the semiconductor wafer is fixed to a grinding stage, and a grindstone is lowered toward the semiconductor wafer with a grindstone and the grinding stage kept rotating to grind the back surface of the semiconductor wafer. In general, it is necessary to protect the front surface of the semiconductor wafer under the grinding process in order to prevent the element structure part from being damaged or contaminated by turnings or water used for grinding.

Projections and depressions of the element structure part appear on the front surface of the semiconductor wafer. In recent years, as the semiconductor wafer has been made thinner to about several tens of μm, such projections and depressions of the front surface have become relatively large. This poses a problem that the semiconductor wafer under the grinding process becomes susceptible to cracking due to the projections and depressions of the front surface. In Japanese Patent Application Laid-Open No. 2006-196710 and Japanese Patent Application Laid-Open No. 2001-203255, proposed are methods for performing the grinding process with a protection sheet attached to the front surface of the semiconductor wafer in order to prevent the semiconductor wafer from being cracked. In Japanese Patent Application Laid-Open No. 2006-196710, proposed is a method for reducing the projections and depressions of the element structure part by using a protection sheet containing a thick adhesive layer. Further, in Japanese Patent Application Laid-Open No. 2001-203255, proposed is a method for reducing the projections and depressions of the element structure part by using a laminated sheet containing an intermediate layer having a specific elastic modulus.

In order to reduce a level difference by following the projections and depressions of the front surface of the semiconductor wafer, it is necessary to use a relatively soft member having a small elastic modulus for the intermediate layer of Japanese Patent Application Laid-Open No. 2006-196710 or the adhesive layer of Japanese Patent Application Laid-Open No. 2001-203255. This poses a problem that the protection sheet is deformed by a load from the grindstone under the grinding process, and, when being processed to be thinner, the wafer is also deformed and cracked. In particular, when the thinning process is performed on a difficult-to-grind material such as a silicon carbide substrate or a sapphire substrate, a load applied to the semiconductor wafer becomes large, so that the large load is applied to the protection sheet to deform the protection sheet, which in turn makes a load of a rotary motor unstable, increases a degree of wear on the grindstone, and cracks the wafer.

SUMMARY

An object of the present invention is to prevent a semiconductor wafer under a grinding process from being cracked.

A method for manufacturing a semiconductor device according to the present invention includes forming a surface protection film having an elastic modulus of 2 GPa or more on a first main surface of a semiconductor wafer on which an element structure formed, and placing the semiconductor wafer on a stage with the first main surface facing the stage and grinding a second main surface of the semiconductor wafer opposite to the first main surface.

According to the method for manufacturing a semiconductor device of the present invention, since the surface protection film having an elastic modulus of 2 GPa or more is formed on the first main surface of the semiconductor wafer, the surface protection film is prevented from being deformed due to a load from the grindstone while the semiconductor wafer is under the grinding process. This in turn prevents of the semiconductor wafer from being cracked.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

Figure 1:
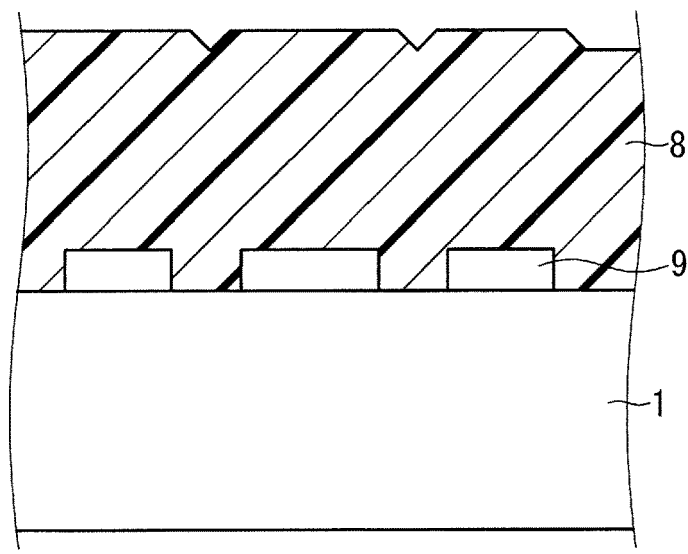
FIG. 1 is a cross-sectional view of a semiconductor wafer having a surface protection film formed on a first main surface of the semiconductor wafer.

FIG. 1 is a cross-sectional view of a semiconductor wafer 1 having a surface protection film 8 formed on a first main surface 1A of the semiconductor wafer 1. The semiconductor wafer 1 has the first main surface 1A and a second main surface 1B that is a main surface opposite to the first main surface 1A. An element structure is formed on the first main surface 1A of the semiconductor wafer 1, and a projection and depression pattern 9 is formed by the element structure. The surface protection film 8 is formed on the first main surface 1A of the semiconductor wafer 1. When the surface protection film 8 is formed on the first main surface 1A, projections and depressions appear on a front surface of the surface protection film 8 due to the projection and depression pattern 9. However, the projections and depressions on the front surface of the surface protection film 8 are reduced by heat treatment thereafter. The surface protection film 8 may be as thick as can cover a level difference caused by the projection and depression pattern 9. For example, assuming that the level difference caused by the projection and depression pattern 9 is 10 μm, the surface protection film 8 is applied to the first main surface 1A with a thickness of about 20 μm. When polyimide resin having an elastic modulus of about 3 GPa is used for the surface protection film 8, heat treatment at about 200° C. generates a structure illustrated in FIG. 1. Note that the surface protection film 8 may be at least a resin member having an elastic modulus of 2 GPa or more, and may have a laminated structure.

Figure 2:
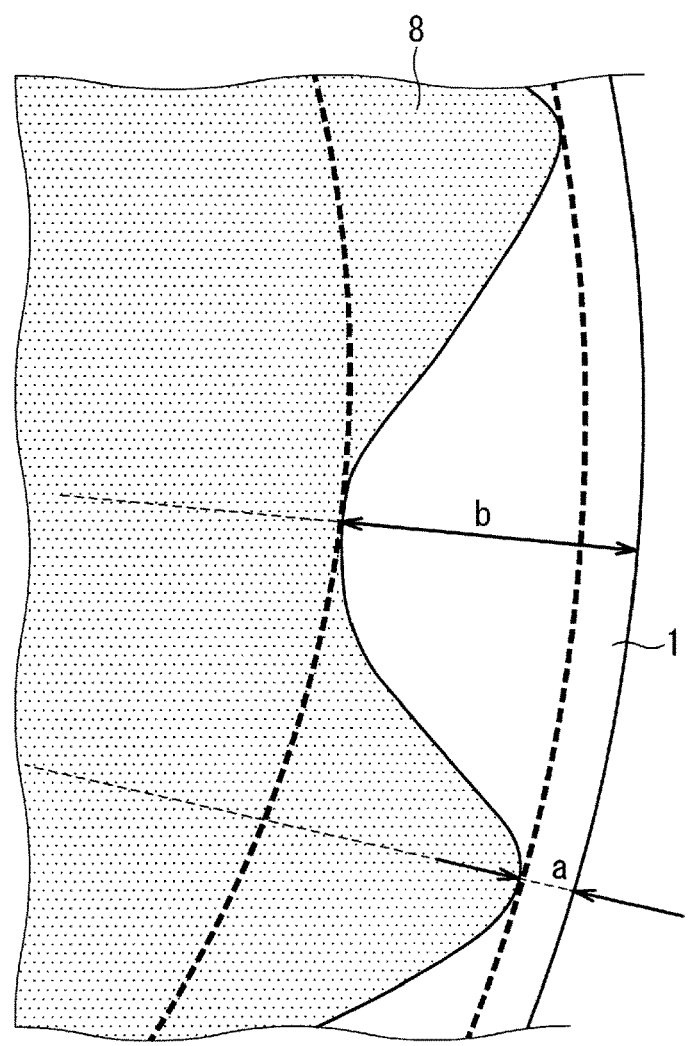
FIG. 2 is a top view of an end of the semiconductor wafer on which the surface protection film has been formed.

FIG. 2 is a top view of an end of the semiconductor wafer 1 on which the surface protection film 8 has been formed. The surface protection film 8 is not necessarily formed all over the semiconductor wafer 1 and is formed over the semiconductor wafer 1 other than the end of the semiconductor wafer 1. Further, the end of the surface protection film 8 is wavy. Therefore, a distance from the end of the semiconductor wafer 1 to an end of the surface protection film 8 varies with position in a circumferential direction on the semiconductor wafer 1, and minimum and maximum values of the distance are denoted by a and b, respectively.

The end of the surface protection film 8 can be made wavy by the following method, for example. In a first method, resin is applied all over the first main surface 1A of the semiconductor wafer 1 by spin coating to form the surface protection film 8. Thereafter, with the semiconductor wafer 1 kept rotating, a remover is discharged to an outer periphery of the semiconductor wafer 1 to dissolve the surface protection film 8, thereby making the surface protection film 8 wavy. In a second method, the surface protection film 8 is formed all over the first main surface 1A of the semiconductor wafer 1 as in the first method, and then the remover is discharged to the second main surface 1B with the semiconductor wafer 1 kept rotating. Then, the remover that has flowed along the outer periphery of the first main surface 1A of the semiconductor wafer 1 dissolves the surface protection film 8, thereby making the surface protection film 8 wavy. In a third method, resin is applied to the first main surface 1A of the semiconductor wafer 1 with a dispenser to make an end of the first main surface 1A wavy.

The minimum value of the distance from the end of the semiconductor wafer 1 to the end of the surface protection film 8 is equal to or greater than 0.1 mm, and the maximum value b is equal to or less than 1.3 mm. The above-described heat treatment on the surface protection film 8 may be performed either before or after making the end of the surface protection film 8 wavy.

Next, a description will be given of a thinning process on the semiconductor wafer 1. The thinning process is performed after the surface protection film 8 is formed. First, the semiconductor wafer 1 is fixed to a grinding stage 7 with the first main surface 1A facing the grinding stage 7. Then, the grinding stage 7 is rotated, and a wheel 6 to which a grindstone 5 is attached is rotated and lowered to cause the grindstone 5 to grind the second main surface 1B of the semiconductor wafer 1.

Figure 3:
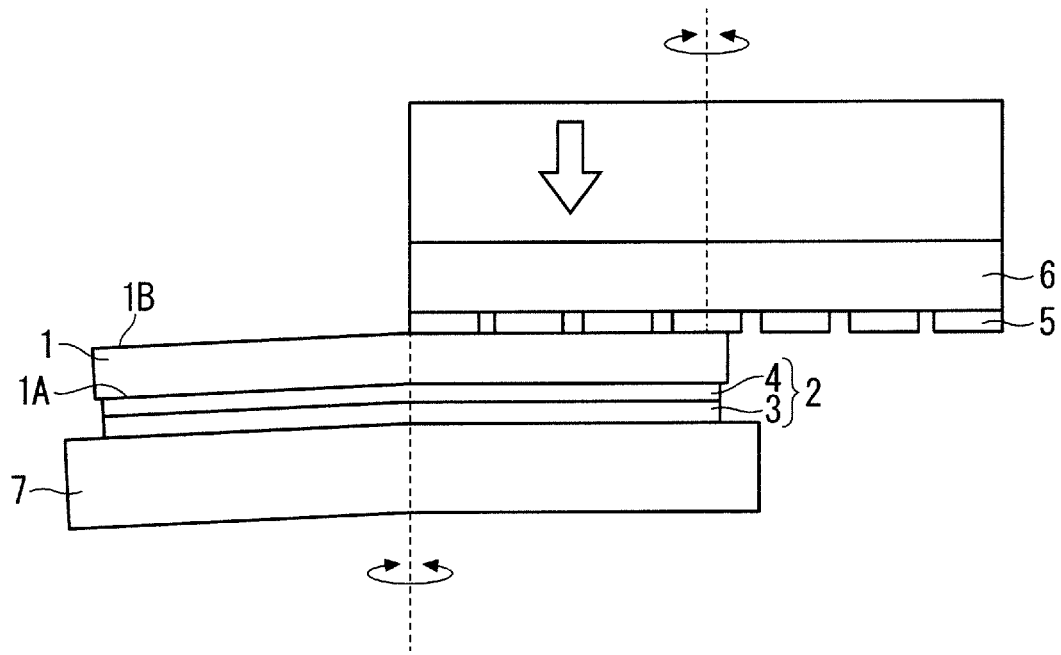
FIGS. 3 and 4 are diagrams illustrating a grinding process on a semiconductor wafer of a comparative example.

FIG. 3 illustrates, as a comparative example, a grinding process on the semiconductor wafer 1 having a protection sheet 2 formed on the first main surface 1A. Such a protection sheet 2 typically has a laminated structure of a base sheet 3 and an adhesive layer 4. The base sheet 3 is made of a material having a relatively high elastic modulus of 1 GPa or more, such as polyester, polyolefin resin, or polyimide, or ethylene vinyl acetate copolymer resin having a relatively low elastic modulus of 1 GPa or less. The adhesive layer 4 is made of acrylic resin having an elastic modulus of about 1 MPa.

Figure 4:
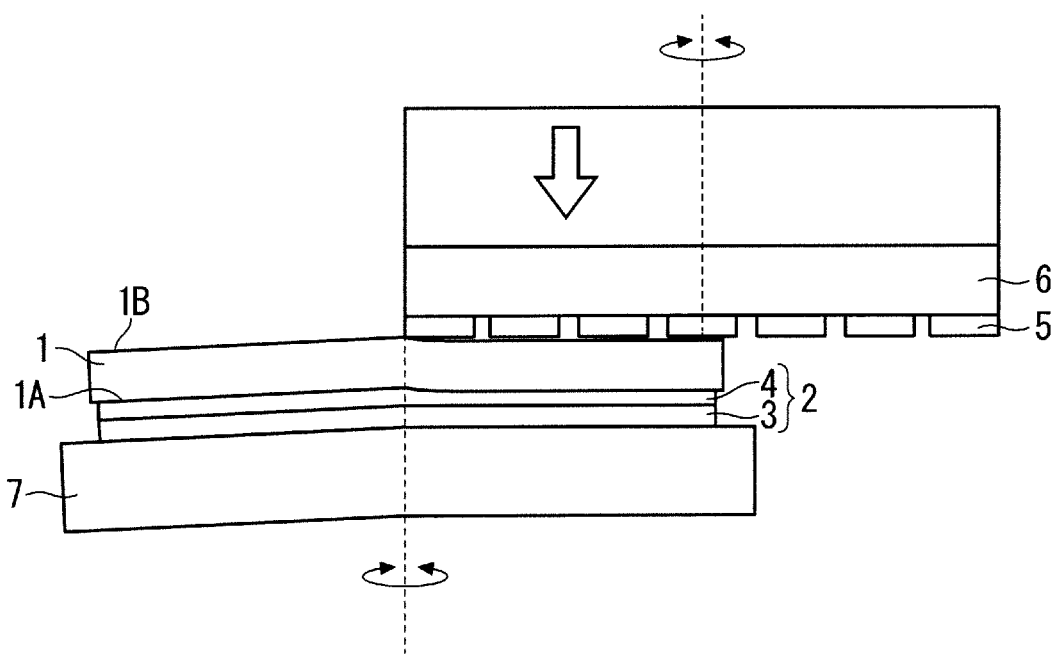

When the second main surface 1B is ground to make the semiconductor wafer 1 thinner, as illustrated in FIG. 4, the protection sheet 2 is deformed by a load from the grindstone 5, and accordingly the semiconductor wafer 1 is also deformed and becomes susceptible to cracking. The base sheet 3 may contain an intermediate layer for accommodating the level difference caused by the projection and depression pattern 9, and, in such a configuration, the elastic modulus of the intermediate layer is about 1 MPa. This configuration makes the semiconductor wafer 1 further susceptible to deformation or cracking. Further, the load from the grindstone 5 is not directly transmitted to the semiconductor wafer 1 under the grinding process, which makes a load of a rotary motor of the wheel 6 unstable or makes a degree of wear on the grindstone 5 uneven.

Figure 5:
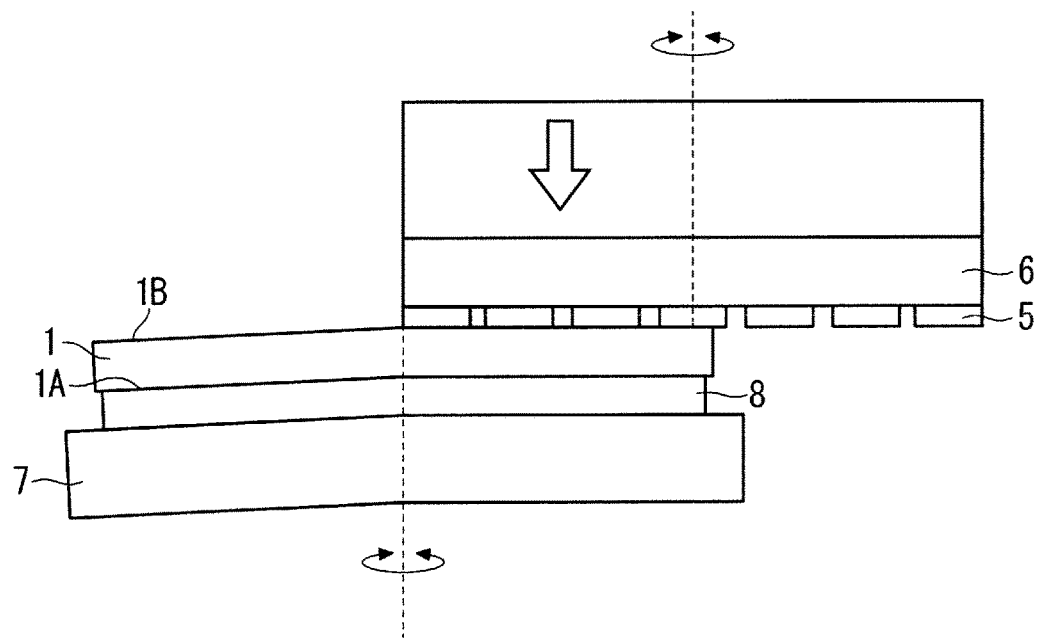
FIG. 5 is a diagram illustrating a grinding process on a semiconductor wafer of a first preferred embodiment.

On the other hand, in a configuration of the first preferred embodiment, formed on the first main surface 1A of the semiconductor wafer 1 is the surface protection film 8 rather than the protection sheet 2. The surface protection film 8 having high rigidity due to the elastic modulus of 2 GPa or more can be prevented from being deformed by the load from the grindstone 5 during the grinding process, as illustrated in FIG. 5. This in turn eliminates the problem that may arise in the comparative example.

Figure 6:
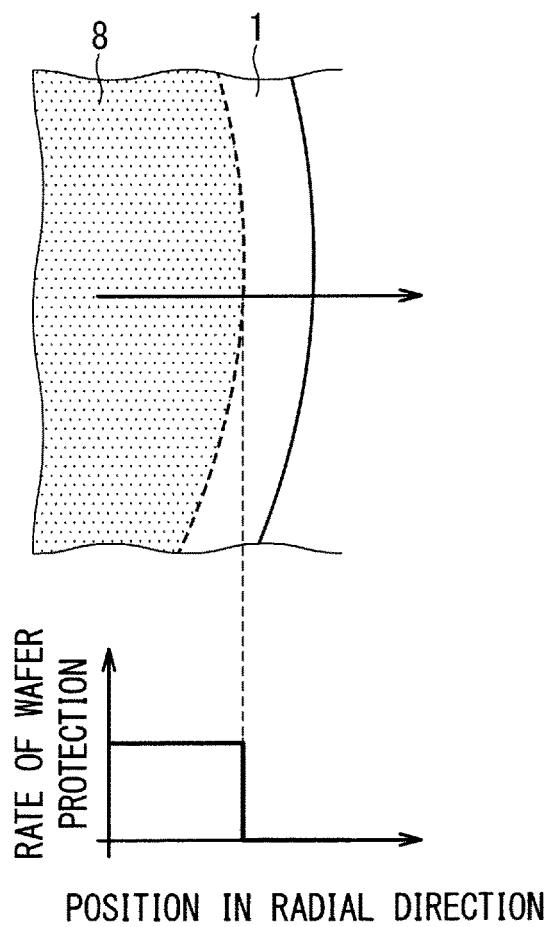
FIG. 6 is a diagram illustrating a rate of wafer protection of the semiconductor wafer of the comparative example.

Next, a description will be given of a rate of wafer protection by the surface protection film 8. FIG. 6 illustrates a rate of wafer protection of the semiconductor wafer 1 of the comparative example. In this comparative example, the end of the surface protection film 8 is not wavy and has a constant distance from the end of the semiconductor wafer 1. An abscissa axis of a graph of FIG. 6 represents a position on the semiconductor wafer 1 in a radial direction, and an ordinate axis represents the rate of wafer protection. Note that the rate of wafer protection refers to a degree of protection, by the surface protection film 8, of the semiconductor wafer 1 at points on the first main surface 1A of the semiconductor wafer 1, the points being located on a circle about a center of the first main surface 1A of the semiconductor wafer 1. In the comparative example, the rate of wafer protection varies discontinuously along the radial direction of the semiconductor wafer 1, which makes the end of the semiconductor wafer 1 susceptible to cracking.

Figure 7:
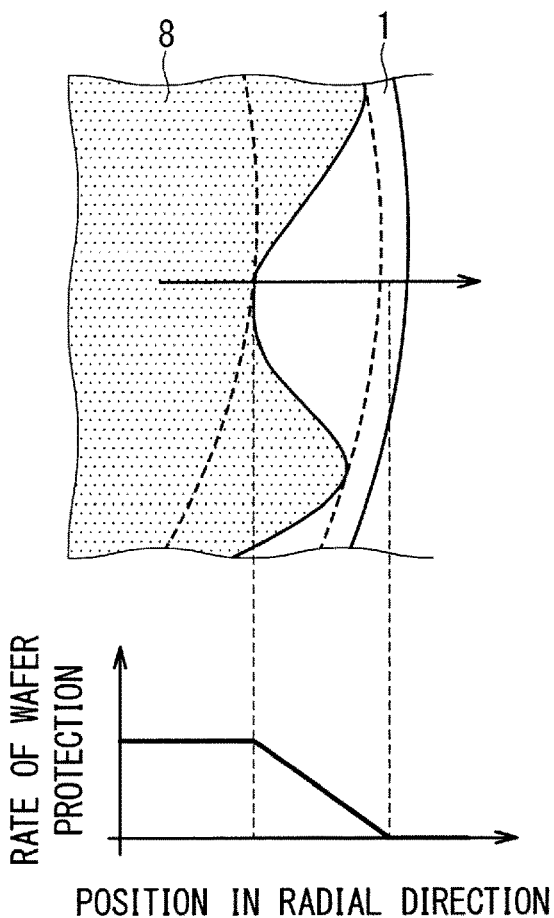
FIG. 7 is a diagram illustrating a rate of wafer protection of the semiconductor wafer of the first preferred embodiment.

On the other hand, as illustrated in FIG. 7, in the semiconductor wafer 1 of the first preferred embodiment, since the end of the surface protection film 8 is formed into a wave shape, the rate of wafer protection varies continuously along the radial direction of the semiconductor wafer 1. This makes it possible to reduce a variation in load in the radial direction that the semiconductor wafer 1 receives from the grindstone 5 under the thinning process and accordingly prevent the end of the semiconductor wafer 1 from being cracked.

Further, making the minimum value of the distance from the end of the semiconductor wafer 1 to the end of the surface protection film 8 equal to 0.1 mm prevents generation of foreign matter caused by the surface protection film 8 in a process after the wafer thinning. Further, making the maximum value b of the distance from the end of the semiconductor wafer 1 to the end of the surface protection film 8 to 1.3 mm prevents the end of the semiconductor wafer 1 from being cracked.

Figure 8:
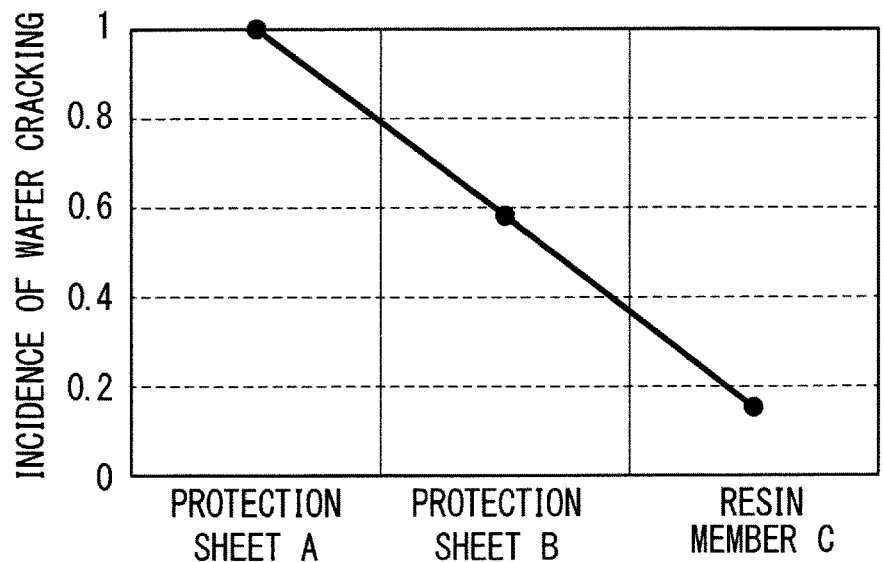
FIG. 8 is a diagram illustrating incidences of wafer cracking in semiconductor wafers having a protection sheet A, a protection sheet B, and a resin member C formed on their respective first main surfaces.

In particular, in a configuration where a hard-to-grind material such as a silicon carbide substrate or a sapphire substrate is used for the semiconductor wafer 1, the load on the semiconductor wafer 1 under the grinding process is large, so that an effect of the above-described rate of wafer protection is significant. FIG. 8 illustrates incidences of wafer cracking when the silicon carbide substrate is protected by a protection sheet A, a protection sheet B, and a resin member C corresponding to the surface protection film 8 of the first preferred embodiment, and is ground to 100 μm or less. Note that an ordinate axis of FIG. 8 represents an incidence of wafer cracking that corresponds to a value normalized with a value of the protection sheet A set to 1.

The protection sheet A has a laminated structure of a base, an intermediate layer, and an adhesive layer in which the base has a thickness of about 150 μm, and the intermediate layer and the adhesive layer have a thickness of about 80 μm in total. The protection sheet B has a laminated structure of a base and an adhesive layer in which the base has a thickness of about 120 μm, and the adhesive layer has a thickness of about 20 μm. Since, in the protection sheet A, the intermediate layer and adhesive layer having a low elastic modulus are thicker, deformation of the protection sheet A due to the load from the grindstone 5 becomes larger, and accordingly the incidence of wafer cracking presumably becomes higher. Since, in the protection sheet B, the adhesive layer is thinner, the incidence of wafer cracking becomes low compared to the protection sheet A. Further, the resin member C having neither the intermediate layer nor the adhesive layer is subjected to the smallest deformation and further reduces the variation in load in the radial direction on the surface protection film 8, which presumably prevents the end of semiconductor wafer 1 from being cracked.

According a method for manufacturing a semiconductor device of the first preferred embodiment, the surface protection film 8 having an elastic modulus of 2 GPa or more is formed on the first main surface 1A of the semiconductor wafer 1 where the element structure is formed, the semiconductor wafer 1 is placed on the grinding stage 7 with the first main surface 1A facing the grinding stage 7, and the second main surface 1B of the semiconductor wafer 1 opposite to the first main surface 1A is ground. Since the elastic modulus of the surface protection film 8 is equal to or greater than 2 GPa, the deformation of the surface protection film 8 due to the load from the grindstone 5 is prevented while the semiconductor wafer 1 is under the grinding process. This in turn prevents the semiconductor wafer 1 from being deformed or cracked. This further makes the load of the rotary motor of the wheel 6 stable, and accordingly makes the degree of wear on the grindstone 5 less uneven.

Further, polyimide can be used for the surface protection film 8. Since the polyimide has an elastic modulus of about 3 GPa, the above-described effect can be obtained.

Further, forming the end of the surface protection film 8 inside the end of the first main surface 1A of the semiconductor wafer 1 makes it possible to prevent generation, in the semiconductor wafer 1, of foreign matter caused by the surface protection film 8.

Further, making the end of the surface protection film 8 wavy allows the rate of protection of the semiconductor wafer 1 by the surface protection film 8 to continuously vary along the radial direction of the semiconductor wafer 1. This reduces the variation in the load in the radial direction that the semiconductor wafer 1 receives from the grindstone 5 under the thinning process and accordingly prevents the end of the semiconductor wafer 1 from being cracked.

Further, forming the surface protection film 8 to make the minimum value of the distance between the end of the surface protection film 8 and the end of the first main surface 1A of the semiconductor wafer 1 equal to or greater than 0.1 mm makes it possible to prevent the generation, in the semiconductor wafer 1, of foreign matter caused by the surface protection film 8.

Further, forming the surface protection film 8 to make the maximum value of the distance between the end of the surface protection film 8 and the end of the first main surface 1A of the semiconductor wafer 1 equal to or less than 1.3 mm makes it possible to prevent the end of the semiconductor wafer 1 from being cracked.

The thickness of the surface protection film 8 is made equal to or greater than a thickness of a pattern of the element structure formed on the first main surface 1A of the semiconductor wafer 1. This allows the surface protection film 8 to cover the level difference caused by the projection and depression pattern 9 of the element structure.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, the method comprising:
    forming a surface protection film having an elastic modulus of 2 GPa or more on a first main surface of a semiconductor wafer on which an element structure formed, to make an end of the surface protection film wavy such that a distance from an end of the semiconductor wafer to the end of the surface protection film varies with position in a circumferential direction on the semiconductor wafer; and
    placing the semiconductor wafer on a stage with the first main surface facing the stage and grinding a second main surface of the semiconductor wafer opposite to the first main surface.

2. The method for manufacturing a semiconductor device according to claim 1, wherein
    the surface protection film is made of polyimide.

3. The method for manufacturing a semiconductor device according to claim 1, wherein
    the forming of the surface protection film is forming the surface protection film to position the end of the surface protection film inside an end of the first main surface of the semiconductor wafer.

4. The method for manufacturing a semiconductor device according to claim 3, wherein
    the forming of the surface protection film is forming the surface protection film to make a minimum value of a distance between the end of the surface protection film and the end of the first main surface of the semiconductor wafer equal to or greater than 0.1 mm.

5. The method for manufacturing a semiconductor device according to claim 3, wherein
the forming of the surface protection film is forming the surface protection film to make a maximum value of the distance between the end of the surface protection film and the end of the first main surface of the semiconductor wafer equal to or less than 1.3 mm.

6. The method for manufacturing a semiconductor device according to claim 1, wherein
a thickness of the surface protection film is equal to or greater than a thickness of a pattern made by the element structure formed on the first main surface of the semiconductor wafer.

* * * * *